United States Patent [19]

Seiter

[11] 3,960,619

[45] June 1, 1976

[54] PROCESS FOR PREPARING LAYERS OF SILICON CARBIDE ON A SILICON SUBSTRATE

[75] Inventor: Hartmut Seiter, Munich, Germany

[73] Assignee: Consortium fur Elecktrochemische Industrie GmbH, Munich, Germany

[22] Filed: Nov. 29, 1974

[21] Appl. No.: 528,050

[30] Foreign Application Priority Data

Dec. 28, 1973    Germany............................ 2364989

[52] U.S. Cl................................. 148/175; 148/174; 156/610; 156/612; 156/613; 156/614; 252/62.3 C; 423/345; 423/346
[51] Int. Cl.²................ H01L 21/205; C01B 31/36
[58] Field of Search ............ 148/174, 175; 423/345, 423/346; 252/62.3 C; 156/610, 612, 613, 614

[56] References Cited
UNITED STATES PATENTS

| | | | |
|---|---|---|---|
| 3,157,541 | 11/1964 | Heywang et al. ..................... | 148/174 |
| 3,171,755 | 3/1965 | Reuschel et al. ............... | 423/345 X |
| 3,335,049 | 8/1967 | Pultz .................................... | 423/346 |
| 3,386,866 | 6/1968 | Ebert et al. ......................... | 148/175 |
| 3,519,472 | 7/1970 | Dyne et al. ..................... | 423/345 X |
| 3,527,626 | 8/1970 | Brander ......................... | 252/62.3 C |
| 3,755,541 | 8/1973 | Strepkoff ........................... | 423/346 |

OTHER PUBLICATIONS

Brander, R. W., "Epitaxial Growth of SiC Layers" Silicon Carbide Textbook—1973, Marshall et al., Editors—Sept. 20, 1973.
Jackson, et al., "Fabrication of Epitaxial SiC Film on Silicon" Trans. Metallurgical Soc. AIME, vol. 33, Mar. 1965, pp. 468–472.
Bean et al., "Some Properties of Vapor Deposited SiC" J. Electrochem. Soc., vol. 114, No. 11, Nov. 1967, pp. 1158–1161.

*Primary Examiner*—L. Dewayne Rutledge
*Assistant Examiner*—W. G. Saba
*Attorney, Agent, or Firm*—Allison C. Collard

[57] ABSTRACT

In a process for producing an epitaxial layer of hexagonal silicon carbide on a silicon monocrystal substrate by simultaneous reduction or thermal decomposition of a gas mixture containing silicon halides and organosilanes, or mixtures thereof, hydrocarbons, and $H_2$ on said substrate, the improvement consisting of having water or a water-forming compound present in the gas mixture, which leads to especially pure silicon carbide, useful, e.g. as material for light emitting diodes.

5 Claims, No Drawings

PROCESS FOR PREPARING LAYERS OF SILICON CARBIDE ON A SILICON SUBSTRATE

The present invention relates to a process for preparing an epitaxial layer of hexagonal silicon carbide on a substrate of a monocrystal of silicon. The large band gap renders silicon carbide a useful starting material for structural semiconductor elements emitting visible light, or a material that can be operated at a high environmental temperature and/or high voltage.

It is known to deposit epitaxially silicon carbide in its hexagonal modification on a silicon carbide substrate at temperatures above 1500°C; German patent No. (1,236,482). It is further known to deposit epitaxially silicon carbide in its cubic modification on a silicon substrate at temperatures ranging from 1100° to 1400°C; (DTPS No. 1,215,665 and German Offenlegungsschrift No. 1,467,088). Since the band gap of the hexagonal modification amounting to 3.0 eV is considerably larger than that of the cubic modification amounting to 2.4 eV, the advantages of silicon carbide as semi-conductor material are only really apparent with hexagonal silicon carbide. Thus, for instance, for making light emitting diodes which emit visible light, the hexagonal modification is mandatory. The disadvantage of the processes for making layers of silicon carbide of hexagonal modification known from descriptions in the literature consists of the necessity of using the required high temperatures which readily lead to the occurrence of impurities from the apparatus; another inconvenience consists in the fact that the substrate of silicon carbide monocrystal is difficult to manufacture as a thin plane parallel platelet which is the form best suitable for the purpose in question.

It is the object of the present invention to make epitaxially silicon carbide layers of the hexagonal modification at low temperatures, that is to say at temperatures below 1400°C, (the melting point of silicon lying at 1420°C) whereby the silicon becomes a useful substrate.

This object is achieved according to the invention by providing a process in which an epitaxial layer is formed of hexagonal silicon carbide on a substrate of a monocrystal of silicon by simultaneous reduction of thermal decomposition of a gaseous mixture of silicon halides and/or organosilanes, hydrocarbons and hydrogen, on the silicon substrate, characterized thereby that the gaseous mixture contains water or a compound releasing water at the temperature of operation.

It is surprising that silicon carbide could be produced in the hexagonal modification at temperatures below 1400°C by carrying out the process according to the invention. It renders possible the use of silicon as substrate. As compared to the known process using silicon carbide substrate with high temperatures to bring about deposits, the inventive process spells considerable simplification and reduction of costs.

By using silicon carbide layers made according to the invention and appropriately doped, diodes emitting visible light and other semi-conductor structural elements may be made such as diodes operable at high temperatures and/or high voltages.

As a rule, the preparation of the silicon carbide layers is effected in a reactor known for silicon epitaxial layer formation, such reactors having been conventional and widely publicized. A reactor of this type consists, for instance, of a quartz vessel with a graphite body therein, onto which the silicon substrates are deposited. The graphite body may be heated up to the desired temperature by means of a high frequency coil surrounding the quartz vessel from the outside. In general, the temperature ranges from 1100° to 1400°C, preferably from 1200° to 1300°C; it is measured pyrometrically. It is advantageous to use a silicon substrate with a surface having the Miller indices (111) or (110). Before the silicon carbide is deposited, a pre-treatment of the surface of the silicon substrate is carried out, e.g. by tempering at 1200°C or by etching with gas, e.g. HCl, or water. By the treatment, a surface is obtained for layer formation thereon. After the pretreatment, the gaseous mixture is passed over the substrate at the deposition temperature either in premixed form or in the form of the several individual components.

The main component of the gas mixture is hydrogen, which serves as carrier gas and reducing agent. The silicon halide or organosilanes are present in the amounts of 0.1 to 5% by volume. The mixture further contains 0.1 to 5% by volume hydrocarbons. Water or a water-releasing compound are added in amount of 0.01 to 1% by volume.

As silicon halides we may use, e.g. silicon bromides or silicon iodides, but preferably silicon chlorides such as $SiCl_4$, $SiHCl_3$ and $SiH_2Cl_2$ or mixtures of the same. The organosilanes used are preferably alkylsilanes, e.g. $SiR_4$, $SiR_3Cl$, $SiR_2Cl_2$ and $SiRCl_3$, or mixtures thereof, R standing for alkyl radicals with 1 to 4 C atoms or hydrogen.

Examples for hydrocarbons are aliphatic hydrocarbons, particularly alkanes and alkenes with 1-8 C atoms, such as methane, ethane, ethylene, propane, propylene, butane or mixtures thereof.

As water-forming compounds we mention oxygen containing carbon compounds, e.g. alcohols, aldehydes, carboxylic acids, preferably $CO_2$, as well as oxygen-containing nitrogen compounds, e.g. nitrogen oxides, for instance $N_2O$, NO or $NO_2$. Mixtures of these compounds may likewise be used.

The presence of water in the reaction zone counteracts the deposit of elementary carbon and/or elementary silicon. This results in the formation of pure silicon carbide without admixture of silicon or carbon. This also helps to avoid the formation of undesirable nuclei of silicon carbide on $SiO_2$ layers, which are used as protective covering in a selective deposition of silicon carbide. If such a selective, local deposition of silicon carbide is desired, a perforated sheet of $SiO_2$, e.g. 1 $\mu$m thick, is made on the silicon substrate in accordance with the method used in this art. Where the silicon substrate is accessible, silicon carbide is deposited. However, on the $SiO_2$ layer, there will be no deposit of silicon carbide. Instead of $SiO_2$, silicon nitride may also be used.

The silicon carbide layer is doped by adding volatile compounds of the elements of the 3rd and 5th main groups of the Periodic System to the reaction gas, e.g. volatile compounds of boron and aluminum, e.g. $B_2H_6$, $BCl_3$, or $AlCl_3$ for p-doping, and volatile compounds of phosphorus or arsenic, e.g. $PH_3$ or $AsCl_3$ for n-doting. When a p-n-transition is desired, a switch to a different doping agent is made during the silicon carbide formation.

In the following, the process of the invention will be more fully illustrated by a specific example, but it should be understood that this is given by way of illustration and not of limitation.

EXAMPLE

For depositing silicon carbide, a reactor is used in which the substrate is horizontally arranged and heated by a high frequency coil; the gas flow is vertical. A graphite cylinder coated with silicon carbide serves as receiver for the silicon substrate. The temperature, pyrometrically determined, is 1200°C while silicon carbide is deposited. The silicon substrate having a surface with the index (111) is heated to 1200°C in the reactor, which had previously been rinsed with hydrogen, and is treated for 15 minutes with a mixture of 600 liter/hour $H_2$ and 0.5 liter/hour $CO_2$. The treatment results in a removal of silicon of about 3 $\mu M$. Immediately thereafter, silicon carbide is deposited on the silicon substrate from a mixture of 600 liter/hour $H_2$, 0.25 liter/hour $CO_2$, 6 liter/hour $SiCl_4$ and 2 liter/hour propylene. After 120 minutes, the thickness of the layer of silicon carbide is about 10 $\mu m$.

When the silicon substrate is dissolved in a mixture of $HNO_3$ and HF, a clear and transparent silicon carbide layer is isolated.

X-ray examination of the silicon carbide layer by means of Laue transmission shows a point diagram with six fold symmetry. The Debye-Scherrer photo of the powdered silicon carbide layer shows the same diagram as a crystalline powder made from a silicon carbide monocrystal of the hexagonal modification.

What is claimed is:

1. In a process for producing an epitaxial layer of hexagonal silicon carbide on a silicon monocrystal substrate by simultaneous reduction or thermal decomposition of a gas mixture containing silicon halides and organosilanes, mixtures of the two, hydrocarbons, and hydrogen on said substrate, the improvement, which consists of having water present in said gas mixture.

2. The process according to claim 1, wherein the water is formed at the reaction temperature from a compound present in the gas mixture.

3. The process according to claim 2, wherein the compound added for water formation is $CO_2$.

4. The process according to claim 1 which comprises the step of pre-treating the surface of the substrate by tempering at about 1200°C for improving its suitability for layer formation thereon.

5. The process according to claim 1 which comprises the step of pre-treating the surface of the substrate by etching it with a gas at the temperature of 1200°C for improving its suitability for layer formation thereon.

* * * * *